United States Patent
Matsumura

(10) Patent No.: US 9,197,223 B2
(45) Date of Patent: Nov. 24, 2015

(54) ELECTRONIC CIRCUIT, RADAR APPARATUS, AND METHOD OF PERFORMING SELF-DIAGNOSIS ON RADAR APPARATUS

(71) Applicant: FUJITSU LIMITED, Kawasaki-shi, Kanagawa (JP)

(72) Inventor: Hiroshi Matsumura, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 129 days.

(21) Appl. No.: 14/159,626

(22) Filed: Jan. 21, 2014

(65) Prior Publication Data

US 2014/0266345 A1 Sep. 18, 2014

(30) Foreign Application Priority Data

Mar. 1, 2013 (JP) .................. 2013-040363

(51) Int. Cl.
| | |
|---|---|
| *H04B 7/185* | (2006.01) |
| *H03L 7/085* | (2006.01) |
| *H03L 7/07* | (2006.01) |
| *G01S 7/40* | (2006.01) |
| *G01S 13/34* | (2006.01) |
| *G01S 13/44* | (2006.01) |
| *G01S 13/93* | (2006.01) |

(52) U.S. Cl.
CPC .............. *H03L 7/085* (2013.01); *G01S 7/4056* (2013.01); *G01S 13/345* (2013.01); *H03L 7/07* (2013.01); *G01S 13/44* (2013.01); *G01S 13/931* (2013.01); *G01S 2007/4065* (2013.01); *G01S 2007/4091* (2013.01)

(58) Field of Classification Search
CPC .................... G01S 13/44; G01S 2007/4091
USPC .............. 455/12.1, 1, 423–425, 67.11, 7, 20, 455/403, 422.1, 73, 550.1, 95, 98, 118, 130, 455/500, 517, 426.1, 426.2; 342/169, 165, 342/172, 174

See application file for complete search history.

(56) References Cited

U.S. PATENT DOCUMENTS

| | | |
|---|---|---|
| 5,964,880 A | 10/1999 | Liu et al. |
| 2004/0012447 A1* | 1/2004 | Nagaishi et al. ................... 331/2 |
| 2010/0171648 A1 | 7/2010 | Himmelstoss et al. |

FOREIGN PATENT DOCUMENTS

| | | |
|---|---|---|
| JP | 2003-14837 A1 | 1/2003 |
| JP | 2012-198070 A | 10/2012 |

OTHER PUBLICATIONS

Extended European Search Report dated Jun. 6, 2014 in the corresponding European patent application No. 14152227.6.

* cited by examiner

*Primary Examiner* — Keith Ferguson
(74) *Attorney, Agent, or Firm* — Kratz, Quintos & Hanson, LLP

(57) ABSTRACT

An electronic circuit includes a first PLL circuit including a first frequency divider whose frequency-division ratio is variably controlled, a second frequency divider configured to divide a frequency of a signal input into the first frequency divider, a delay circuit configured to delay an output signal of the second frequency divider, a second PLL circuit configured to receive an output signal of the delay circuit as a reference signal, and a mixer circuit configured to receive as inputs an oscillating signal of the first PLL circuit and an oscillating signal of the second PLL circuit.

8 Claims, 8 Drawing Sheets

ELECTRONIC CIRCUIT, RADAR APPARATUS, AND METHOD OF PERFORMING SELF-DIAGNOSIS ON RADAR APPARATUS

CROSS-REFERENCE TO RELATED APPLICATIONS

The present application is based upon and claims the benefit of priority from the prior Japanese Patent Application No. 2013-040363 filed on Mar. 1, 2013, with the Japanese Patent Office, the entire contents of which are incorporated herein by reference.

FIELD

The disclosures herein relate to an electronic circuit for performing self-diagnosis for a radar apparatus, and also relate to a radar apparatus and a method of performing self-diagnosis on a radar apparatus.

BACKGROUND

A millimeter-wave radar apparatus transmits millimeter radio waves from a transmitter, and then receives and analyzes the millimeter radio waves reflected by an object, thereby measuring the distance to the object and a relative speed (i.e., a difference in velocity between the object and the radar apparatus). The millimeter-wave radar apparatus may be installed in an automobile to provide a cruise control system for controlling the drive speed to maintain a constant inter-vehicle distance or to provide an automatic braking system for avoiding collision or for reducing impact speed.

Reduction in the cost of millimeter-wave radar apparatuses may require reduction in the testing processes performed in the manufacturing line. High safety standards may be required for a millimeter-wave radar apparatus for use in an automobile. Preventing malfunction is vital, and the ability to monitor a failure during the radar operation is a desired feature. In order to satisfy such requirements, a BIST (built-in self-test) circuit for testing purposes may be incorporated in a transceiver circuit.

One type of a millimeter-wave radar apparatus for measuring the distance and relative speed to the object is an FMCW (frequency modulation continuous wave) radar apparatus. The FMCW radar apparatus transmits millimeter radio waves with triangular frequency modulation, and measures the distance and relative speed to the object through calculation based on a difference in frequency between a received signal and the transmitted signal.

In the FMCW radar apparatus, a PLL (phase locked loop) circuit for generating a high-frequency transmission signal to be transmitted from the radar changes the frequency division ratio of the frequency divider in a triangular wave form, thereby generating a high-frequency transmission signal with triangular frequency modulation. In order to conduct a test inside a circuit by incorporating a BIST circuit in such an FMCW radar apparatus, a PLL circuit and a frequency-division-ratio control circuit may be provided to produce a dummy received signal for test purposes, in addition to the provision of the PLL circuit and the frequency-division-ratio control circuit for generating a transmission signal. Such a configuration means that complicated frequency-division-ratio control circuits are provided separately for each of the transmission purpose and the reception purpose, resulting in increases in circuit size, power consumption, and cost.

RELATED-ART DOCUMENTS

Patent Document

[Patent Document 1] Japanese Laid-Open Patent Publication No. 2003-14837

SUMMARY

According to an aspect of the embodiment, an electronic circuit includes a first PLL circuit including a first frequency divider whose frequency-division ratio is variably controlled, a second frequency divider configured to divide a frequency of a signal input into the first frequency divider, a delay circuit configured to delay an output signal of the second frequency divider, a second PLL circuit configured to receive an output signal of the delay circuit as a reference signal, and a mixer circuit configured to receive as inputs an oscillating signal of the first PLL circuit and an oscillating signal of the second PLL circuit.

A radar apparatus includes a first PLL circuit including a first frequency divider whose frequency-division ratio is variably controlled, a second frequency divider configured to divide a frequency of a signal input into the first frequency divider, a delay circuit configured to delay an output signal of the second frequency divider, a second PLL circuit configured to receive an output signal of the delay circuit as a reference signal, a first signal path through which a received signal from a reception antenna propagates, a second signal path configured to supply the oscillating signal of the second PLL circuit to the first signal path, a mixer circuit configured to receive as inputs a signal propagating through the first signal path and an oscillating signal of the first PLL circuit, a third signal path configured to supply the oscillating signal of the first PLL circuit to a transmission antenna, an AD-conversion circuit configured to convert an output signal of the mixer circuit into a digital signal, and a signal processing circuit configured to detect frequency components of an output signal of the AD-conversion circuit.

A method of performing self-diagnosis on a radar apparatus includes causing a first PLL circuit to produce a first oscillating signal while variably controlling a frequency-division ratio of a first frequency divider of the first PLL circuit, causing a second frequency divider to divide a frequency of a signal input into the first frequency divider, causing a delay circuit to delay an output signal of the second frequency divider, causing the second PLL circuit, using an output signal of the delay circuit as a reference signal, to produce a second oscillating signal, inputting the first oscillating signal and the second oscillating signal to a mixer circuit, detecting a frequency difference between a frequency of the first oscillating signal and a frequency of the second oscillating signal based on an output of the mixer circuit, and checking whether the detected frequency difference is consistent with the frequency-division ratio of the first frequency divider and a delay time of the delay circuit.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

For comparison purposes, a description will be first given of a radar apparatus provided with a PLL circuit and a frequency-division-ratio control circuit for generating a dummy received signal for test purposes, in addition to the PLL circuit and the frequency-division-ratio control circuit for generating a transmission signal. A further description will be given of the process for calculating the distance and relative speed to the object, which is performed as a radar function during a routine operation.

Figure 1:
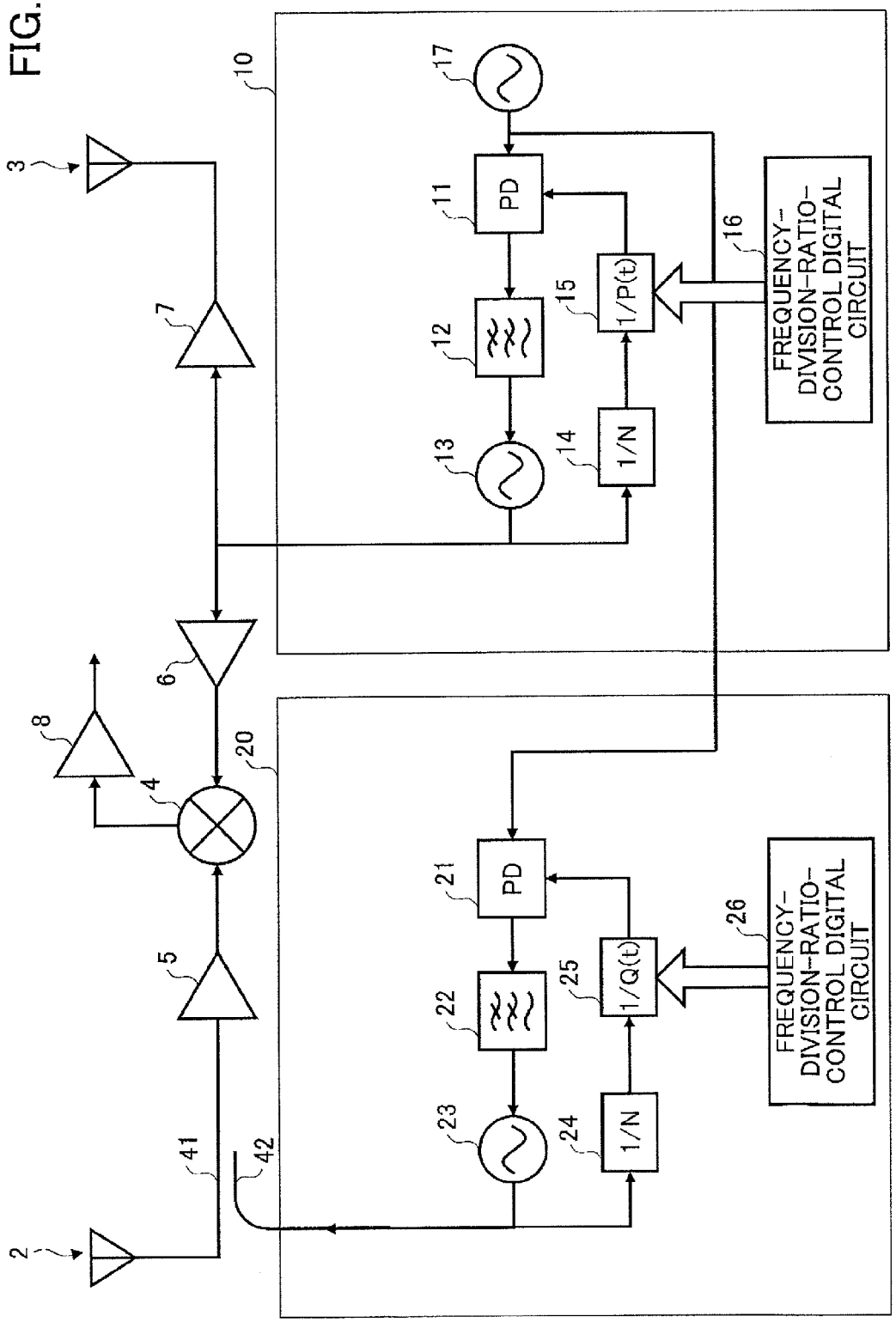
FIG. 1 is a drawing illustrating an example of the configuration of a radar apparatus.

FIG. 1 is a drawing illustrating an example of the configuration of a radar apparatus. The radar apparatus illustrated in FIG. 1 includes a reception antenna 2, a transmission antenna 3, a mixer circuit 4, a low noise amplifier 5, a driver amplifier 6, a power amplifier 7, an intermediate frequency amplifier 8, a transmission-signal-source circuit 10, and a BIST-signal-source circuit 20. The transmission-signal-source circuit 10 includes a phase detector (PD) 11, a loop filter 12, a voltage controlled oscillator 13, a frequency divider 14, a frequency divider 15, a frequency-division-ratio-control digital circuit 16, and an oscillator circuit 17. The BIST-signal-source circuit 20 includes a phase detector (PD) 21, a loop filter 22, a voltage controlled oscillator 23, a frequency divider 24, a frequency divider 25, and a frequency-division-ratio-control digital circuit 26.

In FIG. 1 and the subsequent drawings, boundaries between functional blocks illustrated as boxes basically indicate functional boundaries, and may not correspond to separation in terms of physical positions, separation in terms of electrical signals, separation in terms of control logic, etc. Each functional block may be a hardware module that is physically separated from other blocks to some extent, or may indicate a function in a hardware module in which this and other blocks are physically combined together.

The phase detector 11, the loop filter 12, the voltage controlled oscillator 13, the frequency divider 14, and the frequency divider 15 correspond to a first PLL circuit. The oscillating signal (e.g., 50 MHz) of the oscillator circuit 17 is supplied to the phase detector 11. The phase detector 11 compares phases between a frequency-divided signal supplied from the frequency divider 15 and the oscillating signal supplied from the oscillator circuit 17, thereby supplying to the loop filter 12 a voltage signal indicative of a phase advance or phase delay that is obtained as a result of the phase comparison. The loop filter 12 smooths the voltage signal indicative of a phase advance or phase delay to generate a direct-current voltage. The voltage controlled oscillator 13 oscillates at the frequency responsive to the voltage level of the direct-current voltage that is output from the loop filter 12.

The oscillating signal of the voltage controlled oscillator 13 is frequency-divided by the frequency divider 14 by a factor of 1/N (e.g., ¼). The frequency-divided signal generated by the frequency divider 14 is further divided by the frequency divider 15. The frequency-divided signal generated by the frequency divider 15 is supplied to the phase detector 11. In the configuration illustrated in FIG. 1, the use of the frequency dividers 14 and 15 achieves a large frequency-division ratio, thereby generating a high-frequency oscillating signal. It may suffice to provide only the frequency divider 15 if the frequency divider 15 can attain a sufficiently large frequency-division ratio. It may be noted that the frequency dividers 14 and 15 may be regarded as one frequency divider (i.e., a single contiguous circuit block that achieves a frequency-division function).

The phase detector 21, the loop filter 22, the voltage controlled oscillator 23, the frequency divider 24, and the frequency divider 25 of the BIST-signal-source circuit 20 correspond to a second PLL circuit. The operations of the phase detector 21, the loop filter 22, the voltage controlled oscillator 23, the frequency divider 24, and the frequency divider 25 of the second PLL circuit are the same as or similar to the operations of the phase detector 11, the loop filter 12, the voltage controlled oscillator 13, the frequency divider 14, and the frequency divider 15 described above.

The frequency-division ratio 1/P(t) of the frequency divider 15 is variably controlled by the frequency-division-ratio-control digital circuit 16. Specifically, the frequency-division ratio is triangularly modulated as will be described later. Similarly, the frequency-division ratio 1/Q(t) of the frequency divider 25 is variably controlled by the frequency-division-ratio-control digital circuit 26. Specifically, the frequency-division ratio is triangularly modulated as will be described later.

The oscillating signal of the transmission-signal-source circuit 10 is amplified by the power amplifier 7, and the amplified signal is supplied to the transmission antenna 3. With this arrangement, the transmission antenna 3 transmits (emits) millimeter radio waves. The reception antenna 2 receives millimeter radio waves reflected by an object. The received signal received by the reception antenna 2 is amplified by the low noise amplifier 5, and the amplified signal is supplied to the mixer circuit 4. The oscillating signal (i.e., transmission signal) of the transmission-signal-source circuit 10 is also amplified by the driver amplifier 6 for provision to the mixer circuit 4. The mixer circuit 4 multiplies the received signal of the radar apparatus and the transmission signal to obtain a beat signal, which is supplied to the intermediate frequency amplifier 8. The beat signal has a frequency that is equal to a difference between the frequency of the received signal and the frequency of the transmission signal.

Figure 2:
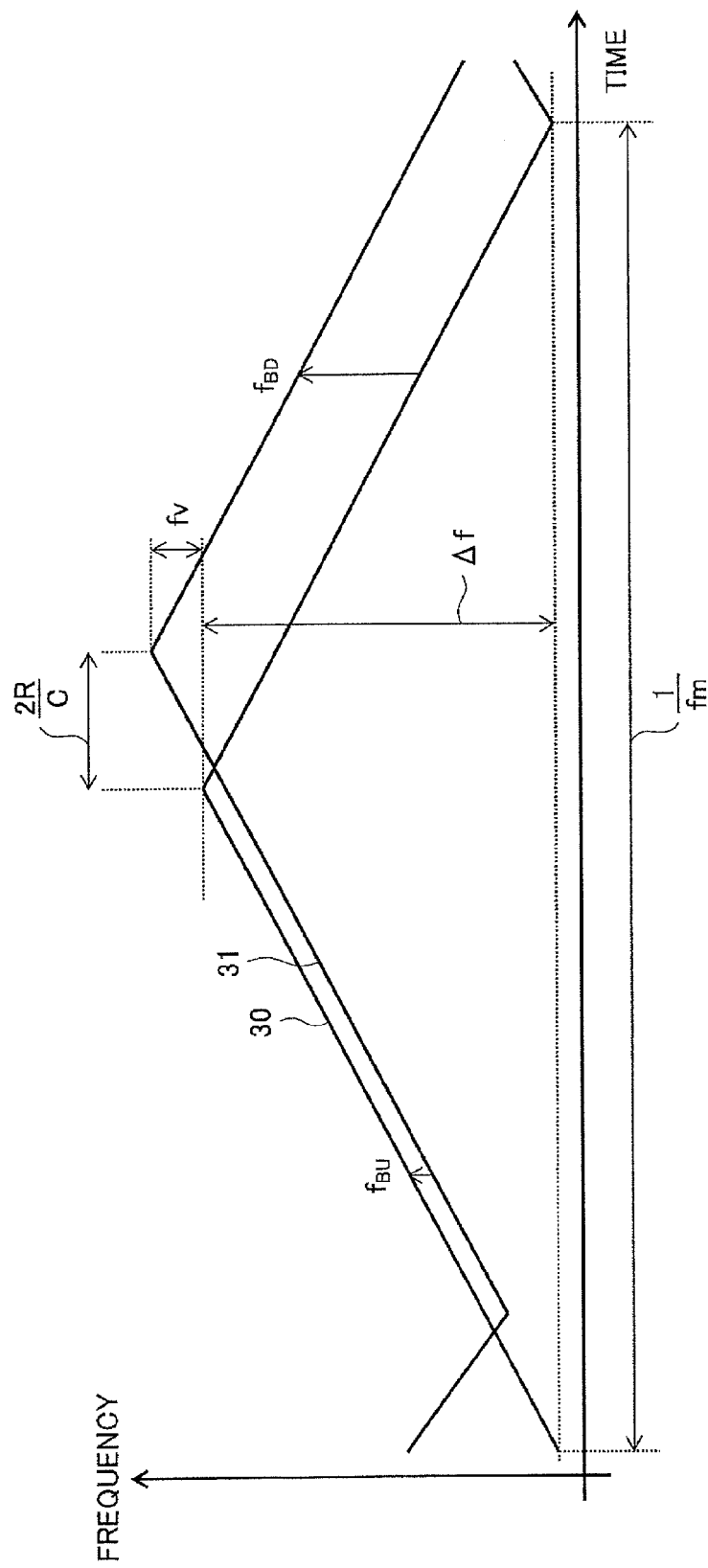
FIG. 2 is a drawing illustrating relationships between a transmission signal and a received signal.

FIG. 2 is a drawing illustrating relationships between the transmission signal and the received signal. In FIG. 2, the horizontal axis represents time, and the vertical axis represents signal frequency. A transmission signal 30 is generated by the transmission-signal-source circuit 10 and transmitted from the transmission antenna 3. A received signal 31 is received by the reception antenna 2. As illustrated in FIG. 2, the transmission signal 30 is modulated such that its frequency draws a triangular wave form. This modulation is realized as the frequency-division-ratio-control digital circuit 16 changes the frequency-division ratio 1/P(t) of the frequency divider 15.

The distance to the object that reflects the millimeter radio waves is denoted as R, and the speed of light (i.e., the propagation velocity of millimeter radio waves in space) is denoted as c. The time difference between the transmission signal 30 and the received signal 31 is then represented as 2R/c. With the relative speed between the object and the radar apparatus being denoted as V and the Doppler shift caused by the speed difference being denoted as $f_v$, the following relationship exists.

$$f_v = (f_{BD} - f_{BU})/2 = 2f_0 V/c \quad (1)$$

The symbol "$f_{BD}$" represents a difference in frequency between the downward slope of the transmission signal 30 and the downward slope of the received signal 31. The symbol "$f_{BU}$" represents a difference in frequency between the upward slope of the transmission signal 30 and the upward slope of the received signal 31. Further, the modulation width (i.e., the difference between the maximum frequency and the minimum frequency) of the transmission signal 30 is denoted as $\Delta f$, and the modulation cycle (i.e., the cycle of the triangular wave) is denoted as $1/f_m$. Then, the following equation is satisfied.

$$(f_{BD} - f_{BU})/2 = 4\Delta f \cdot R \cdot f_m/c \quad (2)$$

The beat signal that is output from the intermediate frequency amplifier 8 alternately exhibits a frequency of $f_{Bc}$ and a frequency of $f_{BU}$. Frequency analysis may be conducted with respect to the spectrum of the beat signal that may be obtained by use of FFT (fast Fourier transform), thereby calculating $f_{BD}$ and $f_{BU}$. The $f_{BD}$ and $f_{BU}$ obtained in this manner are used together with the above-noted equations (1) and (2) to calculate the relative speed V and the distance R.

Referring to FIG. 1 again, the received signal from the reception antenna 2 propagates through a first signal path 41. A second signal path 42 for supplying the oscillating signal of the BIST-signal-source circuit 20 is arranged to provide electric-field coupling or electromagnetic coupling with the first signal path 41. With this arrangement, the oscillating signal of the BIST-signal-source circuit 20 is supplied to the first signal path 41.

The radar apparatus illustrated in FIG. 1 is provided with the BIST-signal-source circuit 20 for the purpose of performing a self-diagnosis at the time of shipment from the factory or performing self-diagnosis during routine operations. In the BIST-signal-source circuit 20, the frequency-division-ratio-control digital circuit 26 controls the frequency-division ratio 1/Q(t) of the frequency divider 25 independently of the transmission-signal-source circuit 10, thereby generating a signal equivalent to the received signal 31 illustrated in FIG. 2, for example. A dummy received signal 31 generated in this manner is supplied to the mixer circuit 4 through the second signal path 42 and the first signal path 41, which makes it possible to perform self-diagnosis using a received signal that resembles an actual received signal observed during routine radar operations. Specifically, a check is made as to whether match exists between the frequency of the transmission signal known to the frequency-division-ratio-control digital circuit 16, the frequency of the dummy received signal known to the frequency-division-ratio-control digital circuit 26, and the frequency difference detected from the beat signal produced by the mixer circuit 4.

In the radar apparatus illustrated in FIG. 1, the BIST-signal-source circuit 20 is provided with the frequency-division-ratio-control digital circuit 26 that is dedicated for the purpose of generating a dummy received signal. Further, the frequency divider 25 is designed for variable frequency-division-ratio control. Since a frequency-division-ratio-control digital circuit and a variable-frequency-division-ratio divider are complicated, the provision of these circuits for the self-diagnosis purposes results in increases in circuit area size, power consumption and cost.

Figure 3:
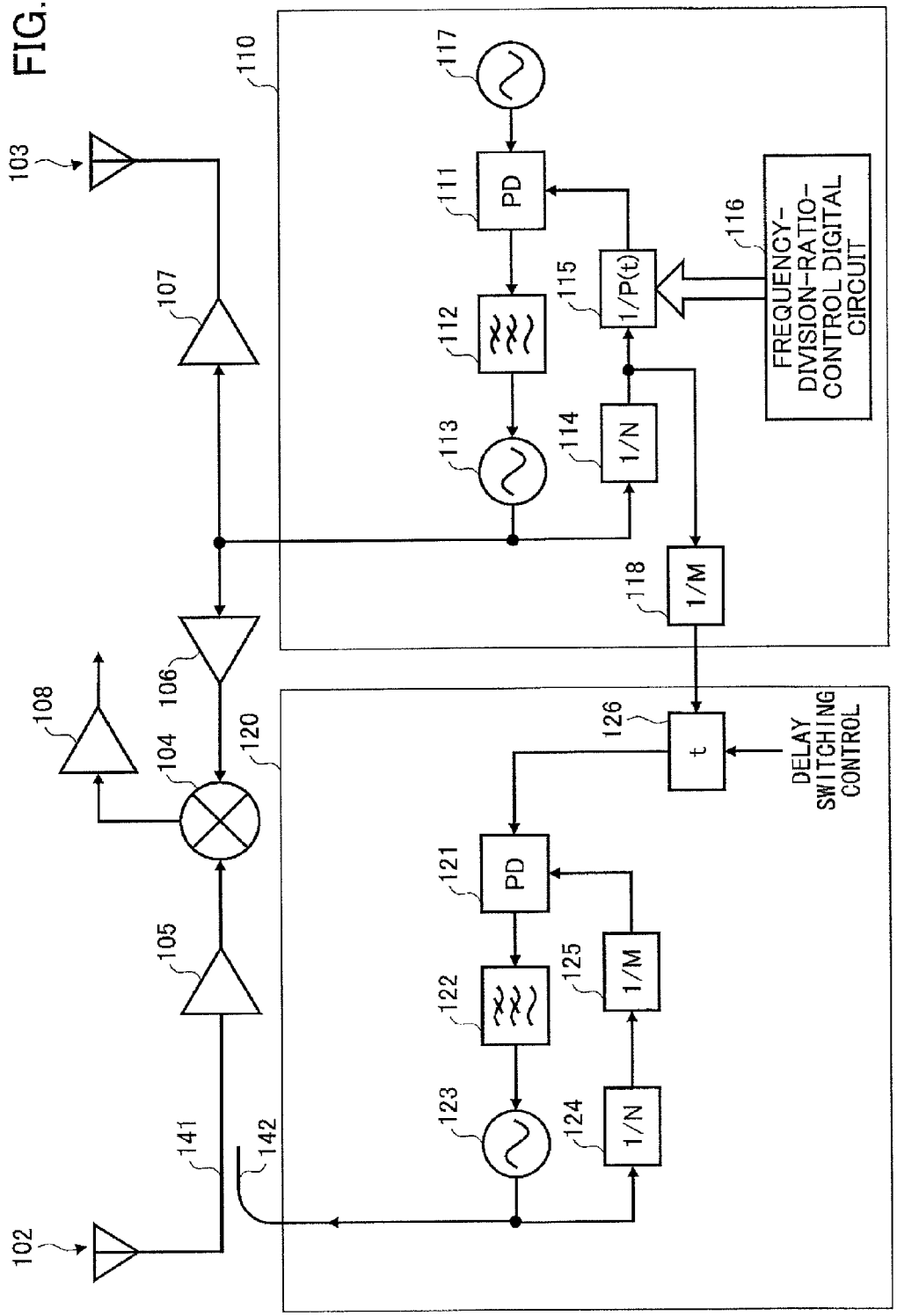
FIG. 3 is a drawing illustrating an example of the configuration of a radar apparatus according to an embodiment.

FIG. 3 is a drawing illustrating an example of the configuration of a radar apparatus according to an embodiment. The radar apparatus illustrated in FIG. 3 includes a reception antenna 102, a transmission antenna 103, a mixer circuit 104, a low noise amplifier 105, a driver amplifier 106, a power amplifier 107, an intermediate frequency amplifier 108, a transmission-signal-source circuit 110, and a BIST-signal-source circuit 120. The transmission-signal-source circuit 110 includes a phase detector (PD) 111, a loop filter 112, a voltage controlled oscillator 113, a frequency divider 114, a frequency divider 115, a frequency-division-ratio-control digital circuit 116, an oscillator circuit 117, and a frequency divider 118. The BIST-signal-source circuit 120 includes a phase detector (PD) 121, a loop filter 122, a voltage controlled oscillator 123, a frequency divider 124, a frequency divider 125, and a delay circuit 126.

The phase detector 111, the loop filter 112, the voltage controlled oscillator 113, the frequency divider 114, and the frequency divider 115 correspond to a first PLL circuit. The operations of the phase detector 111, the loop filter 112, the voltage controlled oscillator 113, the frequency divider 114, and the frequency divider 115 are the same as or similar to the operations of the phase detector 11, the loop filter 12, the voltage controlled oscillator 13, the frequency divider 14, and the frequency divider 15 previously described. In the configuration illustrated in FIG. 3, the use of the frequency dividers 114 and 115 achieves a large frequency-division ratio, thereby generating a high-frequency oscillating signal. It may suffice to provide only the frequency divider 115 if the frequency divider 115 can attain a sufficiently large frequency-division ratio. It may be noted that the frequency dividers 114 and 115 may be regarded as one frequency divider (i.e., a single contiguous circuit block that achieves a frequency-division function). The frequency-division ratio of the frequency divider 115 is variably controlled by the frequency-division-ratio-control digital circuit 116. Specifically, the frequency-division ratio is triangularly modulated.

The oscillating signal of the transmission-signal-source circuit 110 is amplified by the power amplifier 107, and the amplified signal is supplied to the transmission antenna 103. With this arrangement, the transmission antenna 103 transmits (emits) millimeter radio waves. The reception antenna 102 receives millimeter radio waves reflected by an object. The received signal received by the reception antenna 102 is amplified by the low noise amplifier 105, and the amplified signal is supplied to the mixer circuit 104. The oscillating signal (i.e., transmission signal) of the transmission-signal-source circuit 110 is also amplified by the driver amplifier 106 for provision to the mixer circuit 104. The mixer circuit 104 multiplies the received signal of the radar apparatus and the transmission signal to obtain a beat signal, which is supplied to the intermediate frequency amplifier 108. The beat signal has a frequency that is equal to a difference between the frequency of the received signal and the frequency of the transmission signal.

The transmission signal and received signal of the radar apparatus illustrated in FIG. 3 observed during routine radar operations are the same as or similar to the signals illustrated in FIG. 2. The beat signal that is output from the intermediate frequency amplifier 108 alternately exhibits a frequency of $f_{BD}$ and a frequency of $f_{BU}$. Frequency analysis may be conducted with respect to the spectrum of the beat signal that may be obtained by use of FFT (fast Fourier transform), thereby calculating $f_{BD}$ and $f_{BU}$. The $f_{BD}$ and $f_{BU}$ obtained in this manner are used together with the above-noted equations (1) and (2) to calculate the relative speed V and the distance R.

Referring to FIG. 3 again, the received signal from the reception antenna 102 propagates through a first signal path 141. A second signal path 142 for supplying the oscillating signal of the BIST-signal-source circuit 120 is arranged to provide electromagnetic coupling with the first signal path 41. With this arrangement, the oscillating signal of the BIST-signal-source circuit 120 is supplied to the first signal path 141.

The radar apparatus illustrated in FIG. 3 is provided with the BIST-signal-source circuit 120 for the purpose of performing a self-diagnosis at the time of shipment from the factory or performing self-diagnosis during routine operations. In the following, the configuration and operation of the BIST-signal-source circuit 120 will be described.

The phase detector 121, the loop filter 122, the voltage controlled oscillator 123, the frequency divider 124, and the frequency divider 125 of the GIST-signal-source circuit 120 correspond to a second PLL circuit. The transmission-signal-source circuit 110 is provided with the frequency divider 118 that divides the frequency of a signal input into the frequency divider 115 having the frequency division ratio thereof being variably controlled. The delay circuit 126 of the GIST-signal-source circuit 120 delays the output signal of the frequency divider 118 that is supplied from the transmission-signal-source circuit 110. It may be noted that one frequency divider having a frequency-division ratio of 1/(NM) may be provided to divide the frequency of the oscillating signal of the voltage controlled oscillator 113, and that the delay circuit 126 delays the output signal of such a frequency divider. A delay time $\tau$ of the delay circuit 126 may be variably controllable. It may be noted, however, that the variable nature of the delay time $\tau$ of the delay circuit 126 is not essential.

The second PLL circuit of the BIST-signal-source circuit 120 uses the output signal of the delay circuit 126 as a reference signal. The output signal of the delay circuit 126 is supplied to the phase detector 121. The phase detector 121 compares phases between a frequency-divided signal supplied from the frequency divider 125 and the output signal of the delay circuit 126, thereby supplying to the loop filter 122 a voltage signal indicative of a phase advance or phase delay that is obtained as a result of the phase comparison. The loop filter 122 smooths the voltage signal indicative of a phase advance or phase delay to generate a direct-current voltage. The voltage controlled oscillator 123 oscillates at the frequency responsive to the voltage level of the direct-current voltage that is output from the loop filter 122. The oscillating signal of the voltage controlled oscillator 123 is frequency-divided by the frequency divider 124 by a factor of 1/N (e.g., ¼). The frequency-divided signal generated by the frequency divider 124 is further frequency-divided by the frequency divider 125 by a factor of 1/M (e.g., 1/128). The frequency-division ratio of the frequency divider 125 may be the same as the frequency-division ratio of the frequency divider 118.

The frequency-divided signal generated by the frequency divider 125 is supplied to the phase detector 121. In the configuration illustrated in FIG. 3, the use of the frequency dividers 124 and 125 achieves a large frequency-division ratio, thereby generating a high-frequency oscillating signal. It may suffice to provide only the frequency divider 125 if the frequency divider 125 can attain a sufficiently large frequency-division ratio. It may be noted that the frequency dividers 124 and 125 may be regarded as one frequency divider (i.e., a single contiguous circuit block that achieves a frequency-division function).

The second signal path 142 supplies the oscillating signal of the second PLL circuit (i.e., the oscillating signal of the voltage controlled oscillator 123) to the first signal path 141, which transmits the received signal from the reception antenna 102. The second signal path 142 is arranged to provide electric-field coupling or electromagnetic coupling with the first signal path 141. The mixer circuit 104 receives as inputs the signal (i.e., the received signal or the oscillating signal of the second PLL circuit) propagating through the first signal path 141 and the oscillating signal of the first PLL circuit (i.e., the oscillating signal of the voltage controlled oscillator 113). In the case of self-diagnosis, the mixer circuit 104 receives as inputs the oscillating signal of the first PLL circuit (i.e., the transmission signal) and the oscillating signal of the second PLL circuit (i.e., the dummy received signal).

Figure 4:
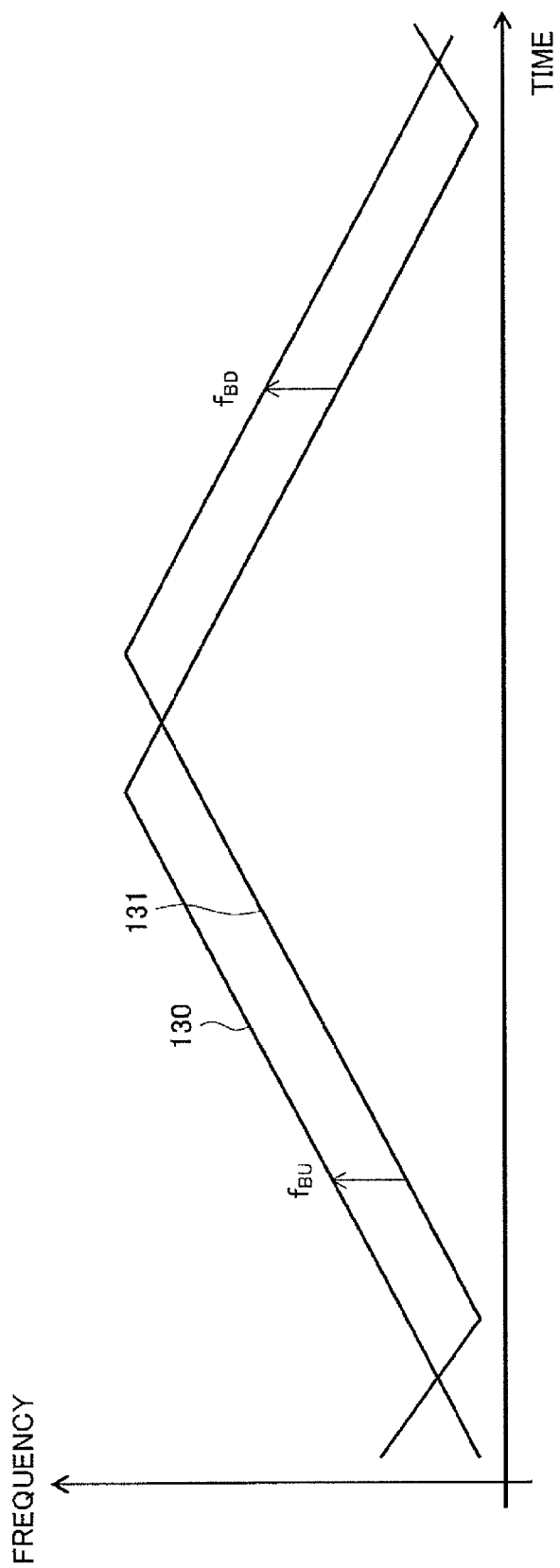
FIG. 4 is a drawing illustrating relationships between a transmission signal and a dummy received signal.

FIG. 4 is a drawing illustrating relationships between the transmission signal and the dummy received signal. In FIG. 4, the horizontal axis represents time, and the vertical axis represents signal frequency. A transmission signal 130 is generated by the transmission-signal-source circuit 110 and transmitted from the transmission antenna 103. A dummy received signal 131 is generated by the BIST-signal-source circuit 120.

The frequency-division ratio of the frequency divider 125 of the GIST-signal-source circuit 120 is equal to the frequency-division ratio of the frequency divider 118 of the transmission-signal-source circuit 110, so that the range of variable frequency of the transmission signal 130 is equal to the range of variable frequency of the dummy received signal 131. A frequency difference $f_{BD}$ between the downward slope of the transmission signal 130 and the downward slope of the dummy received signal 131 is equal to a frequency difference $f_{BU}$ between the upward slope of the transmission signal 130 and the upward slope of the dummy received signal 131.

The provision of a dummy received signal from the second signal path 142 to the mixer circuit 104 through the first signal path 141 as described above allows self-diagnosis to be conducted. Specifically, a check may be made as to whether match exists between the frequency of the transmission signal, the frequency of the dummy received signal, and the frequency difference detected from the beat signal produced by the mixer circuit 104. It may be noted that the frequency of the transmission signal at a given moment corresponds to the frequency-division ratio of the frequency divider 115 at that given moment. Further, the frequency of the dummy received signal at a given moment corresponds to the frequency of the transmission signal observed at a point in time that is displaced from the given moment by a time interval equal to the delay time of the delay circuit 126. Accordingly, in place of the above-noted check, a check may be made as to whether the detected value of the frequency difference as detected from the beat signal is consistent with the frequency-division ratio of the frequency divider 115 and the delay time of the delay circuit 126.

The purpose of self-diagnosis of the radar apparatus is not to diagnose whether the equations (1) and (2) can be correctly calculated, but is to diagnose whether the beat signal output of the mixer circuit 104 has correct frequencies. In the case of measuring the frequencies of the beat signal at the time of self-diagnosis, frequency analysis on the beat signal is conducted during a certain time interval in which a frequency difference between transmission and reception is constant (e.g., a time interval in which both the transmission signal and the reception signal are on the downward slope thereof). In such a case, frequency analysis is conducted separately for each time interval to detect frequency. Because of this, whether frequency is the same or different between adjacent time intervals does not matter when conducting diagnosis as to whether the beat signal has a correct frequency. Namely, the condition that the frequency difference $f_{BL}$ and the frequency difference $f_{BU}$ are different from each other due to Doppler shift, as in the case of the transmission signal 30 and the received signal 31 illustrated in FIG. 2, is not a requirement for self-diagnosis Even when the frequency difference $f_{BL}$ and the frequency difference $f_{BU}$ are equal to each other as in the case of the transmission signal 130 and the dummy received signal 131 illustrated in FIG. 4, self-diagnosis is properly conducted to perform frequency diagnosis on the beat signal to detect frequency separately for each time interval.

Further, for the purpose of conducting a more reliable self-diagnosis, it is preferable to make a diagnosis whether the beat signal output of the mixer circuit 104 has a correct frequency under the various conditions of different frequency differences. A delay circuit with a variable delay time may be used as the delay circuit 126 to make successive, stepwise changes to the delay time, thereby making successive, stepwise changes to the time difference between the transmission signal 130 and the dummy received signal 131. The successive, stepwise changes to the time difference (i.e., the frequency difference) allows the frequency of the beat signal to be successively changed in a stepwise manner, thereby making it possible to conduct self-diagnosis that detects different frequencies for each time interval.

In the radar apparatus illustrated in FIG. 3, the BIST-signal-source circuit 120 is not provided with a frequency-division-ratio-control digital circuit that is dedicated for the purpose of generating a dummy received signal. Further, the frequency divider 125 is designed to have a fixed frequency-division ratio. Compared with the circuit configuration illustrated in FIG. 1, a frequency-division-ratio-control digital circuit and a variable-frequency-division-ratio divider are not used in the radar apparatus illustrated in FIG. 3, which thus has an advantageous circuit configuration in terms of circuit area size, power consumption, and cost.

Figure 5:
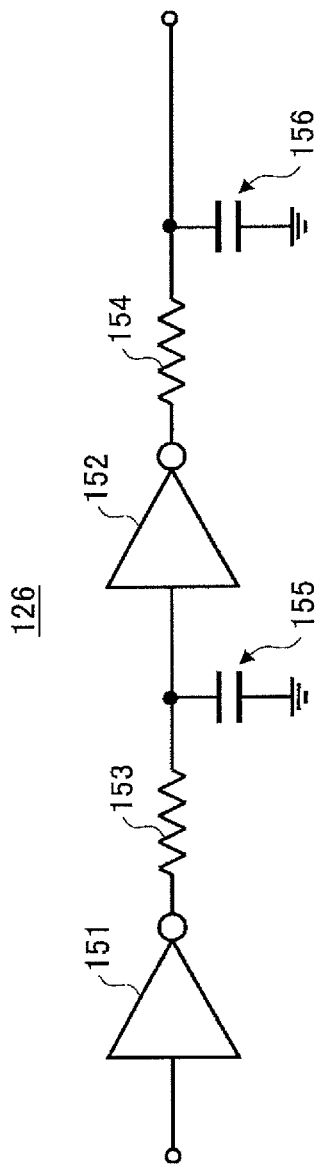
FIG. 5 is a drawing illustrating an example of the configuration of a delay circuit.

FIG. 5 is a drawing illustrating an example of the configuration of the delay circuit 126. The delay circuit 126 illustrated in FIG. 5 includes inverters 151 and 152, resistors 153 and 154, and capacitors 155 and 156. The inverter 151 produces at an output node thereof an output signal having an opposite logic level to an input signal. In response to the voltage of the output signal, an electric current flows through the resistor 153 and the capacitor 155, thereby charging or discharging the capacitor 155. In conjunction with the charging or discharging of the capacitor 155, the voltage of the signal input into the inverter 152 is changed to exceed the threshold voltage of the inverter 152, which results in the output signal voltage of the inverter 152 being changed. The change in the output signal voltage of the inverter 152 causes the capacitor 156 to be changed or discharged in a similar manner. The speed at which the voltage between the opposite nodes of a capacitor changes is controlled by a resistance value R of the resistor and a capacitance value C of the capacitor. The speed at which the voltage between the opposite nodes of a capacitor changes determines the delay time that it takes for a signal to propagate from the input node to the output node of the delay circuit 126.

In the configuration illustrated in FIG. 3, the delay time that may be used in the BIST-signal-source circuit 120 is approximately 10 microseconds. The oscillating signal of the voltage controlled oscillator 113 of the transmission-signal-source circuit 110 may be delayed by a delay circuit to directly generate a dummy received signal. A transmission signal used for a millimeter-wave radar has high frequency such as 77 GHz. In the case of such a high frequency signal, the signal cannot propagate through a signal propagation path due to an increased loss when the resistance value of resistors and the capacitance value of capacitors are increased because of the low input and output impedances of amplifiers used in the signal propagation path. Due to this reason, the resistors and capacitors of the delay circuit 126 may only have, at the maximum, a resistance value of few tens of ohms and a capacitance value of few tens of femto-farads, respectively. In such a case, a delay circuit having a delay time of approximately 10 microseconds ends up having an 80-thousand delay stages each having one resistor and one capacitor (each having a time constant of 126 ps). This is not a realistically achievable circuit size. Conversely, an attempt to make a delay circuit having a realistically achievable number of stages results in the need for larger resistors and capacitors. In such a case, signal propagation becomes impossible due to loss caused by the resistors and mismatch caused by the capacitors.

Accordingly, for the purpose of generating a dummy received signal by delaying a signal inside the transmission-signal-source circuit 110, it is not practical to directly delay the oscillating signal of the voltage controlled oscillator 113, but it is practical to delay a low-frequency signal that is generated by frequency-dividing this oscillating signal. Namely, the delay circuit 126 imposes a delay on the low-frequency signal that is frequency-divided by the frequency dividers 114 and 118 as in the circuit configuration illustrated in FIG. 3. The second PLL circuit then generates a high-frequency signal based on the signal delayed by the delay circuit 126, thereby generating the dummy received signal 131.

Figure 6:
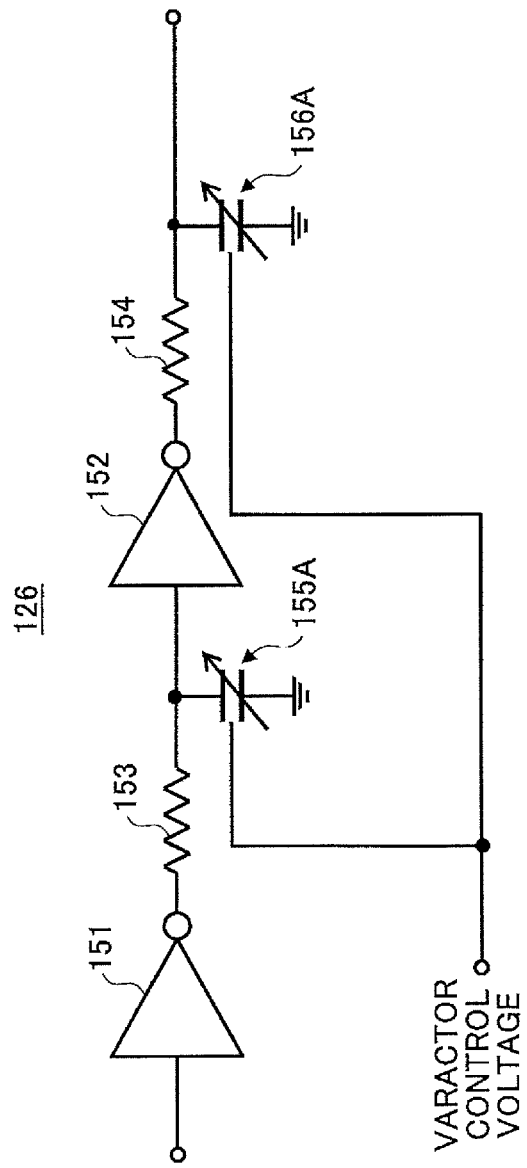
FIG. 6 is a drawing illustrating another example of the configuration of a delay circuit.

FIG. 6 is a drawing illustrating another example of the configuration of the delay circuit 126. In FIG. 6, the same or corresponding elements as those of FIG. 5 are referred to by the same or corresponding numerals, and a description thereof will be omitted as appropriate. The delay circuit 126 illustrated in FIG. 6 differs from the delay circuit 126 illustrated in FIG. 5 in that variable capacitors (i.e., varactors) 155A and 156A are provided in place of the capacitors 155 and 156. A varactor control voltage applied to the control nodes of the variable capacitors 155A and 156A is changed to modify the capacitance values of the variable capacitors 155A and 156A. With this arrangement, the time difference between the transmission signal 130 and the dummy received signal 131 is successively changed in a stepwise manner to perform self-diagnosis with respect to various frequency differences of the beat signal.

Figure 7:
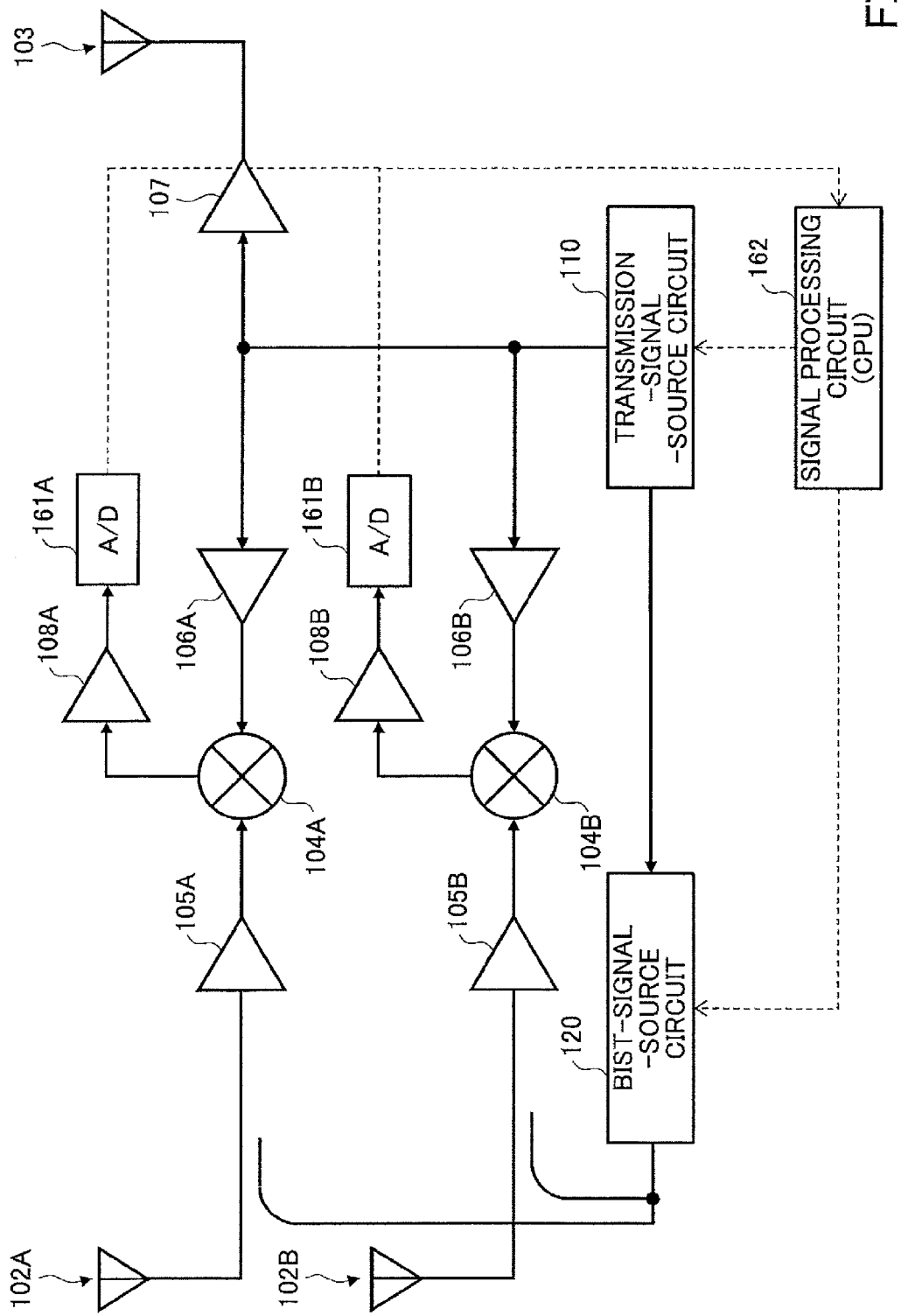
FIG. 7 is a drawing illustrating an example of the configuration of a radar apparatus including a self-diagnosis circuit.

FIG. 7 is a drawing illustrating an example of the configuration of a radar apparatus including a self-diagnosis circuit. In FIG. 7, the same or corresponding elements as those of FIG. 3 are referred to by the same or corresponding numerals, and a description thereof will be omitted as appropriate. It may be noted that FIG. 7 illustrates a configuration in which a phased array antenna made by arranging a plurality of antennas as reception antennas is used. Phase differences between signals received by the plurality of antennas are detected to measure the direction from which the received radio waves arrive. FIG. 7 illustrates a configuration in which two reception antennas and two received-signal processing systems are provided. However, the number of reception antennas and received-signal processing systems is not limited to two, and may be three or more. Alternatively, a circuit configuration may be such that only one reception antenna and only one received-signal processing system are provided without the use of a phased array antenna.

The radar apparatus illustrated in FIG. 7 includes the transmission-signal-source circuit 110, the BIST-signal-source circuit 120, and a signal processing circuit 162. The radar apparatus further includes reception antennas 102A and 102B, the transmission antenna 103, mixer circuits 104A and 104B, low noise amplifiers 105A and 105B, driver amplifiers 106A and 106B, and the power amplifier 107. The radar apparatus further includes intermediate frequency amplifiers 108A and 108B and AD-conversion circuits 161A and 161B. The reception antennas 102A and 102B are provided as an antenna array of the phased array antenna.

The AD-conversion circuit 161A converts the beat signal output of the mixer circuit 104A from analog into digital. The AD-conversion circuit 161B converts the beat signal output of the mixer circuit 104B from analog into digital. The signal processing circuit 162 includes a CPU (central processing unit) and a memory, and receives the digital beat signals from the AD-conversion circuits 161A and 161B, respectively, to perform frequency analysis on each of the beat signals separately. Specifically, the signal processing circuit 162 obtains a frequency spectrum (i.e., amplitude spectrum and phase spectrum) by performing the FFT with respect to each beat signal, and checks whether setting values are consistent with the amplitude, frequency, and phase of the beat signal obtained from the frequency spectrum. The signal processing circuit 162 sets the oscillating frequency (i.e., frequency-division ratio) of the transmission-signal-source circuit 110, and sets the delay time of the delay circuit 126 of the BIST-signal-source circuit 120.

Figure 8:
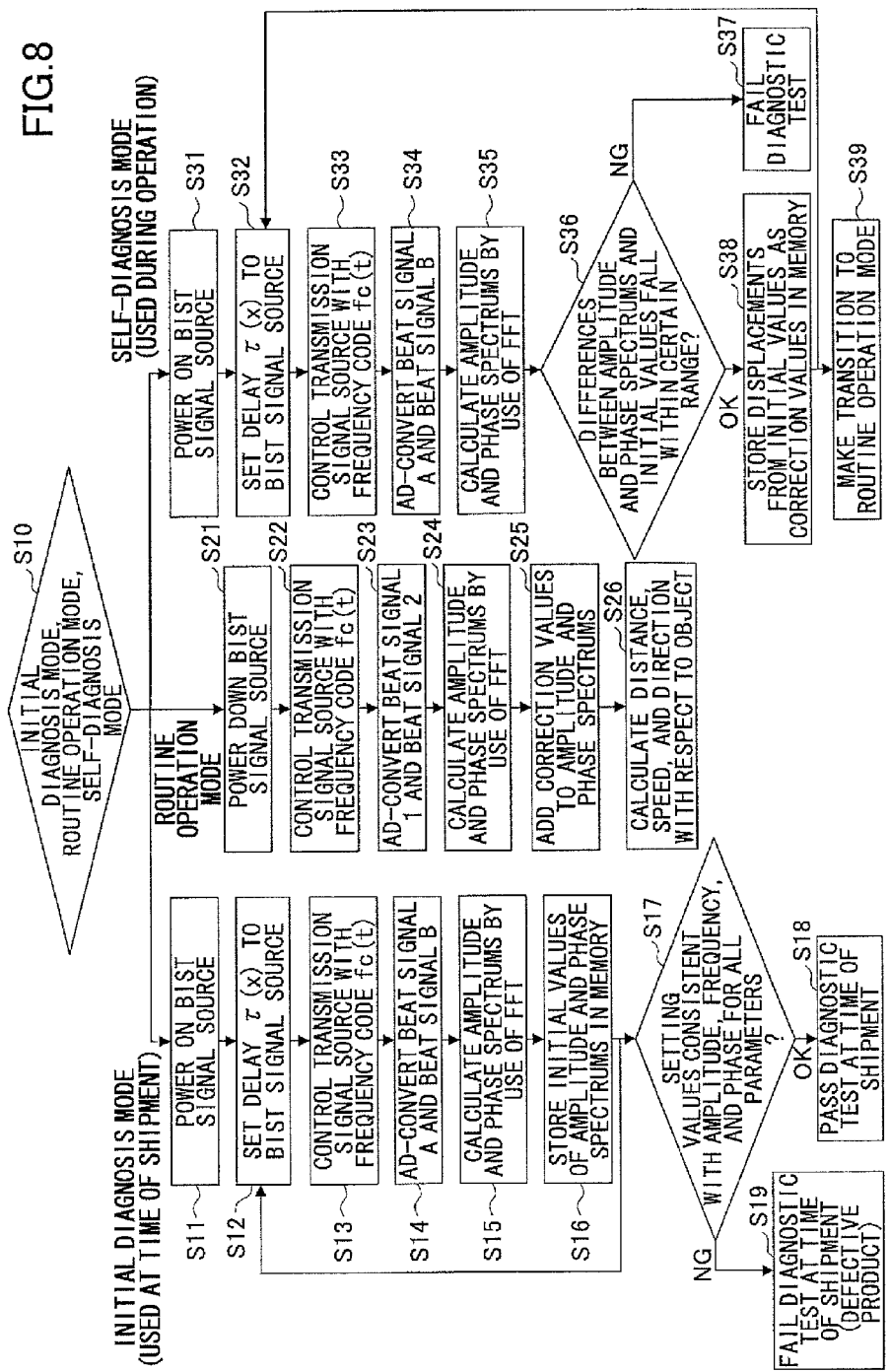
FIG. 8 is a flowchart illustrating an example of the operation of the radar apparatus illustrated in FIG. 7.

FIG. 8 is a flowchart illustrating an example of the operation of the radar apparatus illustrated in FIG. 7. In step S10, the signal processing circuit 162, for example, checks whether the current operation mode is an initial diagnosis mode, a routine operation mode, or a self-diagnosis mode. The initial diagnosis mode is used to perform diagnosis (i.e., self-diagnosis) at the time of shipment of the radar apparatus from the factory. A predetermined command is input into external pins, for example, to notify the signal processing circuit 162 of the initial diagnosis mode. The routine operation mode is used to perform a routine operation in which the radar apparatus performs a radar function. The self-diagnosis mode is used to perform self-diagnosis during an interval between routine operations for performing the radar function or at the time of power-on of the radar apparatus.

When the current operation mode is the self-diagnosis mode (i.e., the mode for performing self-diagnosis at the time of shipment from the factory), the BIST-signal-source circuit 120 is powered on in step S11. Such power control may be performed by the signal processing circuit 162. In step S12, the signal processing circuit 162 sets the delay time τ of the delay circuit 126 to the BIST-signal-source circuit 120. In step S13, the signal processing circuit 162 sets a frequency code fc(t) indicative of an oscillating frequency to the transmission-signal-source circuit 110, followed by causing the transmission-signal-source circuit 110 to produce an oscillating signal. At the time of setting the frequency code, the signal processing circuit 162 sets the upper limit of the oscillating frequency, the lower limit of the oscillating frequency, and the cycle of the triangular modulation to the transmission-signal-source circuit 110. The setting of the upper limit of the oscillating frequency and the lower limit of the oscillating frequency is equivalent to the setting of the upper limit and the lower limit of the frequency-division ratio of the frequency divider 115 that is changed by the frequency-division-ratio-control digital circuit 116. As the transmission-signal-source circuit 110 operates and oscillates, the BIST-signal-source circuit 120 also oscillates to produce a dummy received signal. In step S14, a beat signal A output from the mixer circuit 104A is AD-converted (i.e., analog-to-digital-converted) by the AD-conversion circuit 161A, and a beat signal B output from the mixer circuit 104B is AD-converted by the AD-conversion circuit 161B.

In step S15, the signal processing circuit 162 performs the FFT with respect to each of the AD-converted beat signal A and the AD-converted beat signal B separately, thereby calculating each frequency spectrum (i.e., amplitude spectrum and phase spectrum). In step S16, the signal processing circuit 162 stores the calculated amplitude spectrum and phase spectrum as initial values in memory. These initial values may be stored in memory with respect to each delay time τ.

The procedure then returns to step S12, in which a different delay time τ is set to the BIST-signal-source circuit 120, followed by performing processes of the subsequent steps in the same or similar manner. The above-described processes are repeated multiple times to store the initial values for each of the different delay times τ that are subjected to diagnosis.

In step S17, a check is made with respect to all the parameters (i.e., τ and fc(t)) as to whether the setting values are consistent with the amplitude of the beat signal, the frequency of the beat signal, and the phase of the beat signal obtained from the frequency spectrum. When consistency is found, in step S18, the result of the diagnosis performed at the time of shipment indicates that the apparatus is satisfactory. When consistency is not found, in step S19, the result of the diagnosis performed at the time of shipment indicates that the apparatus is not satisfactory.

When the current operation mode is the routine operation mode, the BIST-signal-source circuit 120 is powered off in step S21. Such power control may be performed by the signal processing circuit 162. In step S22, the signal processing circuit 162 sets a frequency code fc(t) indicative of an oscillating frequency to the transmission-signal-source circuit 110, followed by causing the transmission-signal-source circuit 110 to produce an oscillating signal. At the time of setting the frequency code, the signal processing circuit 162 sets the upper limit of the oscillating frequency, the lower limit of the oscillating frequency, and the cycle of the triangular modulation to the transmission-signal-source circuit 110. In step S23, a beat signal A output from the mixer circuit 104A is AD-converted (i.e., analog-to-digital-converted) by the AD-conversion circuit 161A, and a beat signal B output from the mixer circuit 104B is AD-converted by the AD-conversion circuit 161B.

In step S24, the signal processing circuit 162 performs the FFT with respect to each of the AD-converted beat signal A and the AD-converted beat signal B separately, thereby calculating each frequency spectrum (i.e., amplitude spectrum and phase spectrum). In step S25, the signal processing circuit 162 adds correction values to the calculated amplitude spectrum and phase spectrum. These correction values will be described later. In step s26, the distance to the object, the relative speed to the object, and the direction of the object are calculated based on the frequencies and phases of the beat signals A and B.

When the current operation mode is the self-diagnosis mode, the BIST-signal-source circuit 120 is powered on in step S31. Such power control may be performed by the signal processing circuit 162. In step S32, the signal processing circuit 162 sets the delay time τ of the delay circuit 126 to the BIST-signal-source circuit 120. In step S33, the signal processing circuit 162 sets a frequency code fc(t) indicative of an oscillating frequency to the transmission-signal-source circuit 110, followed by causing the transmission-signal-source circuit 110 to produce an oscillating signal. At the time of setting the frequency code, the signal processing circuit 162 sets the upper limit of the oscillating frequency, the lower limit of the oscillating frequency, and the cycle of the triangular modulation to the transmission-signal-source circuit 110. As the transmission-signal-source circuit 110 operates and oscillates, the BIST-signal-source circuit 120 also oscillates to produce a dummy received signal. In step S34, a beat signal A output from the mixer circuit 104A is AD-converted (i.e., analog-to-digital-converted) by the AD-conversion circuit 161A, and a beat signal B output from the mixer circuit 104B is AD-converted by the AD-conversion circuit 161B.

In step S35, the signal processing circuit 162 performs the FFT with respect to each of the AD-converted beat signal A and the AD-converted beat signal B separately, thereby calculating each frequency spectrum (i.e., amplitude spectrum and phase spectrum). In step S36, the signal processing circuit 162 compares the calculated amplitude spectrum and phase spectrum with the initial values of the amplitude spectrum and phase spectrum that are stored in memory after calculation in the initial diagnosis mode, thereby checking whether differences between these two are within a certain range. When the differences are not within the certain range, in step S37, the result of the self-diagnosis indicates that the apparatus is malfunctioning. When the differences are within the certain range, in step S38, the differences between the calculated values and the initial values are stored as correction values in memory. These correction values are used in step S25 in the routine operation mode.

The procedure then returns to step S32, in which a different delay time τ is set to the BIST-signal-source circuit 120, followed by performing processes of the subsequent steps in the same or similar manner. The above-described processes are repeated multiple times to perform the self-diagnosis check process (i.e., the check process of step S36) for each of the different delay times τ that are subjected to diagnosis. Namely, the delay time of the delay circuit is changed to make a check for each of the different delay times.

The self-diagnosis mode is completed in this manner, followed by making a transition to the routine operation mode in step S39. The self-diagnosis mode may be regularly performed at constant intervals.

The radar apparatus which performs the check process of step S36 is an apparatus that has been determined to be satisfactory by the consistency check in step S17. The fact that the differences between the calculated values and the initial values are found to be within the certain range by the check in step S36 indicates that the calculated amplitude of the beat signal, the calculated frequency of the beat signal, and the calculated phase of the beat signal are consistent with the setting values. Namely, the check process in step S36 may be regarded as a process for checking whether the setting values of τ and fc(t) are consistent with the calculated amplitude of the beat signal, the calculated frequency of the beat signal, and the calculated phase of the beat signal.

Figure 9:
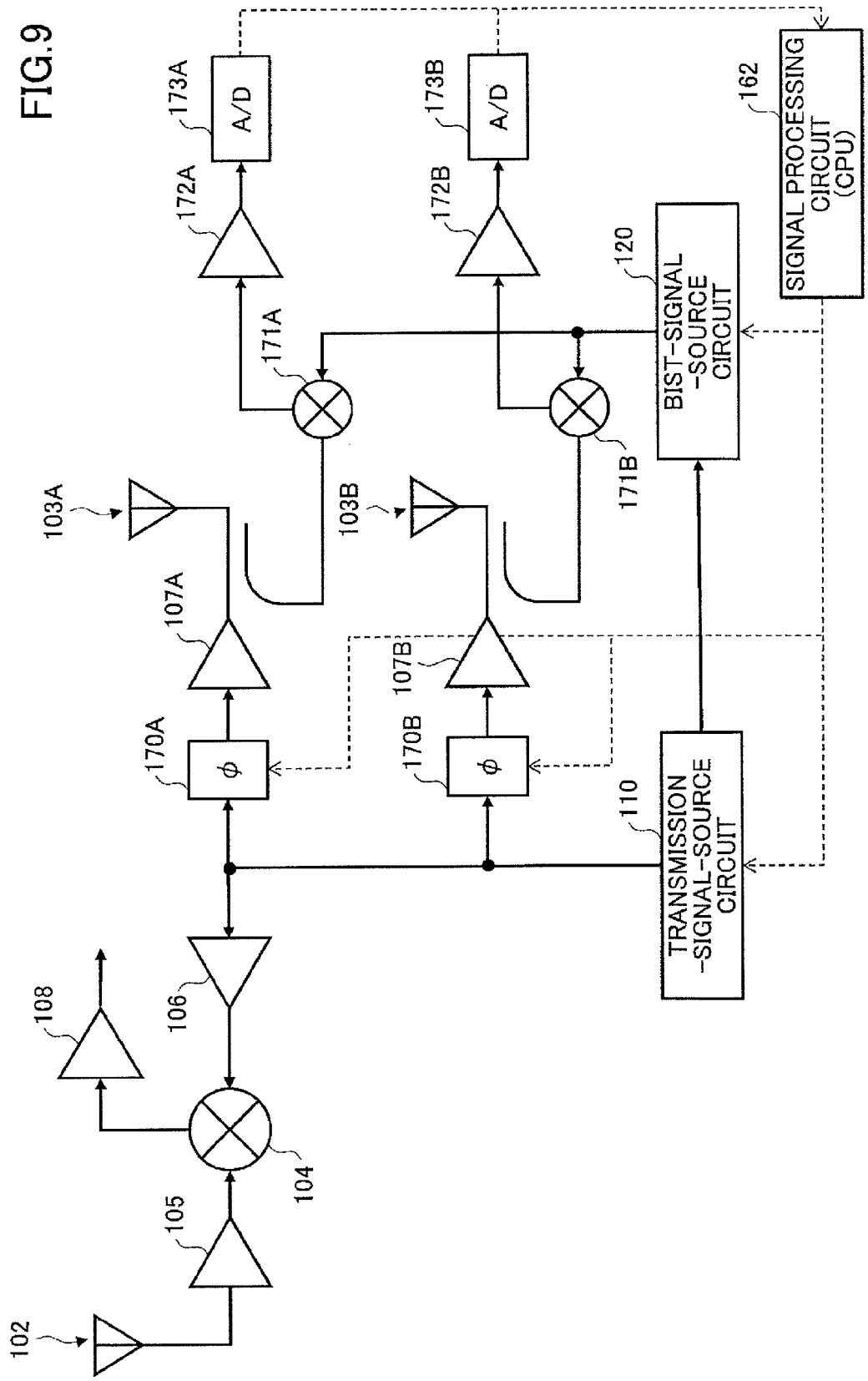
FIG. 9 is a drawing illustrating another example of the configuration of the radar apparatus.

FIG. 9 is a drawing illustrating another example of the configuration of the radar apparatus. In FIG. 9, the same or corresponding elements as those of FIG. 3 are referred to by the same or corresponding numerals, and a description thereof will be omitted as appropriate. It may be noted that FIG. 9 illustrates a configuration in which a phased array antenna made by arranging a plurality of antennas as transmission antennas is used. Giving phase differences to a plurality of transmission signals for transmission from the plurality of antennas makes it possible to emit radio waves in a desired direction. FIG. 7 illustrates a configuration in which two transmission antennas and two transmission-signal processing systems are provided. However, the number of transmission antennas and transmission-signal processing systems is not limited to two, and may be three or more. Alternatively, a circuit configuration may be such that only one transmission antenna and only one transmission-signal processing system are provided without the use of a phased array antenna.

The radar apparatus illustrated in FIG. 9 includes the transmission-signal-source circuit 110, the BIST-signal-source circuit 120, and the signal processing circuit 162. The radar apparatus further includes the reception antenna 102, transmission antennas 103A and 103B, the mixer circuit 104, the low noise amplifier 105, the driver amplifier 106, and power amplifiers 107A and 107B. The radar apparatus further includes the intermediate frequency amplifier 108, phase shifters 170A and 170B, mixer circuits 171A and 171B, intermediate frequency amplifiers 172A and 172B, and AD-conversion circuits 173A and 173B.

The phase of the transmission signal generated by the transmission-signal-source circuit 110 is adjusted by the phase shifters 170A and 170B, and the signals having different phases are transmitted from the transmission antennas 103A and 103B. This achieves a phased array antenna.

In the radar apparatus illustrated in FIG. 9, the BIST-signal-source circuit 120 performs diagnosis with respect to the plurality of transmission signals of the transmission-side phased array antenna. The transmission signal that is generated by the transmission-signal-source circuit 110 and that has a phase thereof adjusted by the phase shifter 170A is input into the mixer circuit 171A. At the time of self-diagnosis, a dummy transmission signal generated by the BIST-signal-source circuit 120 is input into the mixer circuit 171A. The beat signal output of the mixer circuit 171A is amplified by the intermediate frequency amplifier 172A, followed by being AD-converted by the AD-conversion circuit 173A. The digital beat signal that is output from the AD-conversion circuit 173A is supplied to the signal processing circuit 162.

Similarly, the transmission signal that is generated by the transmission-signal-source circuit 110 and that has a phase thereof adjusted by the phase shifter 170B is input into the mixer circuit 171B. At the time of self-diagnosis, a dummy transmission signal generated by the BIST-signal-source circuit 120 is input into the mixer circuit 171B. The beat signal output of the mixer circuit 171B is amplified by the intermediate frequency amplifier 172B, followed by being AD-converted by the AD-conversion circuit 173B. The digital beat signal that is output from the AD-conversion circuit 173B is supplied to the signal processing circuit 162.

The signal processing circuit 162 receives the digital beat signals from the AD-conversion circuits 173A and 173B, respectively, to perform frequency analysis on each of the beat signals separately. Specifically, the signal processing circuit 162 obtains a frequency spectrum (i.e., amplitude spectrum and phase spectrum) by performing the FFT with respect to each beat signal, and checks whether setting values are consistent with the amplitude, frequency, and phase of the beat signal obtained from the frequency spectrum. Based on the check results, the signal processing circuit 162 controls phase shifting performed by the phase shifters 170A and 170B. With this arrangement, proper phase control is provided in the phased-array-type transmitter. The signal processing circuit 162 sets the oscillating frequency (i.e., frequency-division ratio) of the transmission-signal-source circuit 110, and sets the delay time of the delay circuit 126 of the BIST-signal-source circuit 120. The configuration in which the output of the mixer circuit for receiving a received signal is AD-converted for provision to the signal processing circuit 162 as in the configuration illustrated in FIG. 7 may be combined with the configuration illustrated in FIG. 9.

According to at least one embodiment, an electronic circuit is provided that has an efficient circuit configuration for use in a radar apparatus and that is able to perform self-diagnosis with respect to FMCW signals.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. An electronic circuit, comprising:
    a first PLL circuit including a first frequency divider whose frequency-division ratio is variably controlled;
    a second frequency divider configured to divide a frequency of a signal input into the first frequency divider;
    a delay circuit configured to delay an output signal of the second frequency divider;
    a second PLL circuit configured to receive an output signal of the delay circuit as a reference signal; and
    a mixer circuit configured to receive as inputs an oscillating signal of the first PLL circuit and an oscillating signal of the second PLL circuit.

2. The electronic circuit as claimed in claim 1, wherein a delay time of the delay circuit is variably controllable.

3. The electronic circuit as claimed in claim 1, further comprising:
    an AD-conversion circuit configured to convert an output signal of the mixer circuit into a digital signal; and
    a signal processing circuit configured to detect frequency components of an output signal of the AD-conversion circuit and to control the frequency-division ratio of the first frequency divider.

4. The electronic circuit as claimed in claim 3, wherein the signal processing circuit is configured to control a delay time of the delay circuit.

5. The electronic circuit as claimed in claim 1, wherein a signal path through which the oscillating signal of the second PLL circuit propagates is coupled to a signal path through which a received signal from a reception antenna is input into the mixer circuit.

6. A radar apparatus, comprising:
    a first PLL circuit including a first frequency divider whose frequency-division ratio is variably controlled;
    a second frequency divider configured to divide a frequency of a signal input into the first frequency divider;
    a delay circuit configured to delay an output signal of the second frequency divider;
    a second PLL circuit configured to receive an output signal of the delay circuit as a reference signal;
    a first signal path through which a received signal from a reception antenna propagates;
    a second signal path configured to supply the oscillating signal of the second PLL circuit to the first signal path;
    a mixer circuit configured to receive as inputs a signal propagating through the first signal path and an oscillating signal of the first PLL circuit;
    a third signal path configured to supply the oscillating signal of the first PLL circuit to a transmission antenna;
    an AD-conversion circuit configured to convert an output signal of the mixer circuit into a digital signal; and
    a signal processing circuit configured to detect frequency components of an output signal of the AD-conversion circuit.

7. A method of performing self-diagnosis on a radar apparatus, comprising:
    causing a first PLL circuit to produce a first oscillating signal while variably controlling a frequency-division ratio of a first frequency divider of the first PLL circuit;
    causing a second frequency divider to divide a frequency of a signal input into the first frequency divider;
    causing a delay circuit to delay an output signal of the second frequency divider;
    causing the second PLL circuit, using an output signal of the delay circuit as a reference signal, to produce a second oscillating signal;
    inputting the first oscillating signal and the second oscillating signal to a mixer circuit;
    detecting a frequency difference between a frequency of the first oscillating signal and a frequency of the second oscillating signal based on an output of the mixer circuit; and
    checking whether the detected frequency difference is consistent with the frequency-division ratio of the first frequency divider and a delay time of the delay circuit.

8. The method as claimed in claim 7, further comprising changing the delay time of the delay circuit to perform the checking separately for each different delay time.

* * * * *